US007258956B2

(12) United States Patent
Galloway et al.

(10) Patent No.: US 7,258,956 B2
(45) Date of Patent: Aug. 21, 2007

(54) PRINTING PLATES COMPRISING MODIFIED PIGMENT PRODUCTS

(75) Inventors: Collin P. Galloway, Nashua, NH (US); James A. Belmont, Action, MA (US); Rosa Casado-Portilla, Woburn, MA (US)

(73) Assignee: Cabot Corporation, Boston, MA (US)

( * ) Notice: Subject to any disclaimer, the term of this patent is extended or adjusted under 35 U.S.C. 154(b) by 54 days.

(21) Appl. No.: 09/896,886

(22) Filed: Jun. 29, 2001

(65) Prior Publication Data

US 2002/0020318 A1 Feb. 21, 2002

Related U.S. Application Data

(60) Provisional application No. 60/234,063, filed on Sep. 20, 2000, provisional application No. 60/216,089, filed on Jul. 6, 2000.

(51) Int. Cl.

*B41N 1/12* (2006.01)
*B41N 1/00* (2006.01)
*G03F 7/004* (2006.01)
*B41N 1/14* (2006.01)

(52) U.S. Cl. ....................... 430/18; 430/18; 430/271.1; 430/944; 430/138; 430/300; 430/306; 430/302; 430/278.1; 430/270.1

(58) Field of Classification Search ............ 430/270.1, 430/271.1, 278.1, 138
See application file for complete search history.

(56) References Cited

U.S. PATENT DOCUMENTS 2,867,540 A 1/1959 Harris ........................ 106/307
3,335,020 A 8/1967 Aboytes et al. ............. 106/307
3,479,300 A 11/1969 Rivin et al. ................. 252/430
4,014,844 A 3/1977 Vidal et al. ................ 260/31.2
4,873,166 A * 10/1989 Senga et al. ........... 430/137.17
4,909,852 A 3/1990 Atkinson .................... 106/448
4,946,509 A 8/1990 Schwatrz et al. ........... 106/496
5,262,275 A 11/1993 Fan
5,281,261 A * 1/1994 Lin .......................... 106/20 R
5,286,594 A * 2/1994 Sypek et al. ................ 430/138
5,418,277 A 5/1995 Ma et al. .................... 524/520
5,545,504 A 8/1996 Keoshkerian et al. ....... 430/137
5,554,739 A 9/1996 Belmont ..................... 534/885
5,571,311 A 11/1996 Belmont et al. .............. 106/20
5,630,868 A 5/1997 Belmont et al. ......... 106/31.75
5,698,016 A 12/1997 Adams et al. .............. 106/316
5,713,988 A 2/1998 Belmont et al. ........... 106/31.6
5,714,993 A 2/1998 Keoshkerian et al. ......... 347/95
5,716,435 A 2/1998 Aida et al. ............... 106/31.85
5,749,950 A 5/1998 Mahmud et al. ............ 106/316
5,766,268 A 6/1998 Bruhnke ........................ 8/647
5,814,434 A 9/1998 Nakamura et al.
5,837,045 A 11/1998 Johnson et al. .......... 106/31.85
5,851,280 A 12/1998 Belmont et al. ............ 106/472
5,885,335 A 3/1999 Adams et al. ............. 106/316
5,895,522 A 4/1999 Belmont et al. ........... 106/31.6
5,914,806 A 6/1999 Gordon II et al. .......... 359/296
5,919,846 A 7/1999 Batlaw et al. ................ 524/83
5,922,118 A 7/1999 Johnson et al. ............ 106/31.6
5,952,429 A 9/1999 Ikeda et al. .............. 525/326.1
5,964,935 A 10/1999 Chen et al. ................. 106/401
5,968,243 A 10/1999 Belmont et al. ......... 106/31.65
5,976,233 A 11/1999 Osumi et al. ............ 106/31.75
6,042,643 A 3/2000 Belmont et al. ............ 106/472
6,068,688 A 5/2000 Whitehouse et al. .... 106/31.65
6,110,994 A 8/2000 Cooke et al. ............... 523/215
6,150,433 A 11/2000 Tsang et al. ................ 523/160
6,218,073 B1 * 4/2001 Shimizu et al. .......... 430/273.1
6,221,932 B1 4/2001 Moffatt et al. .............. 523/160
6,235,829 B1 5/2001 Kwan ......................... 524/495
6,336,965 B1 1/2002 Johnson et al. ............ 106/31.6
6,350,519 B1 2/2002 Devonport .................. 428/403
6,368,239 B1 4/2002 Devonport ............... 473/449.2
6,372,820 B1 4/2002 Devonport .................. 523/215
6,432,194 B2 8/2002 Johnson et al. ............. 106/499
6,458,458 B1 10/2002 Cooke et al. ............... 428/407
6,472,471 B2 10/2002 Cooke et al. ............... 525/165
6,479,571 B1 11/2002 Cooke et al. ............... 523/215

FOREIGN PATENT DOCUMENTS

EP 0 803 771 A1 * 10/1997
EP 0 803 772 A2 * 10/1997
JP 53-094581 8/1978
JP 01-113472 5/1989
JP 6-128517 5/1994
WO WO96/18688 6/1996

(Continued)

OTHER PUBLICATIONS

Derwent Abstract No. 82-28019E, "Penetrate Flexographic Print Ink Based Polyacrylic Resin Modified Maleinised Rosin Modified Carbon Black" Date of May 1981 for patent document.

(Continued)

*Primary Examiner*—Cynthia Hamilton

(57) ABSTRACT

The present invention discloses printing plates comprising a substrate and a radiation-absorptive layer, wherein the radiation-absorptive layer comprises at least one modified pigment product. The modified pigment product comprises a pigment having attached at least one organic group and at least one amphiphilic counterion. Methods of imaging printing plates are also disclosed.

26 Claims, No Drawings

FOREIGN PATENT DOCUMENTS

| | | | |
|---|---|---|---|
| WO | WO96/18695 | | 6/1996 |
| WO | WO97/47697 | | 12/1997 |
| WO | WO97/48769 | | 12/1997 |
| WO | WO-98/31550 | A1 * | 7/1998 |
| WO | WO99/04974 | | 2/1999 |
| WO | WO99/19143 | | 4/1999 |
| WO | WO99/19144 | | 4/1999 |
| WO | WO99/37481 | | 7/1999 |
| WO | WO99/37482 | | 7/1999 |
| WO | WO-99/51690 | A1 * | 10/1999 |
| WO | WO 00/05313 | | 2/2000 |
| WO | WO 00/16987 | | 3/2000 |
| WO | WO 00/43446 | | 7/2000 |
| WO | WO 00/52102 | | 9/2000 |
| WO | WO 01/25340 | | 4/2001 |

OTHER PUBLICATIONS

JP90-0134478 to Mitsubishi Kasei Corp, Publication Date Jan. 31, 1992, (No Date of Abstract) Abstract Only (from Derwent)).

JP96-0105108 to Mitsubishi Chem Corp, Publication Date Nov. 11, 1997, (No Date of Abstract) Abstract Only (from Derwent)).

"Effect of Hydrogen Acceptors on pKa of Phenol Resins: Links to Dissolution Inhibition," *Macromolecules*, 1998, vol. 31, pp. 7723-7727.

International Preliminary Examination Report for PCT/US2001/20787, dated May 23, 2003.

* cited by examiner

PRINTING PLATES COMPRISING MODIFIED PIGMENT PRODUCTS

BACKGROUND OF THE INVENTION

This application claims priority to U.S. Provisional Patent Application Ser. No. 60/216,089, filed Jul. 6, 2000 and U.S. Provisional Patent Application Ser. No. 60/234,063, filed on Sep. 20, 2000.

FIELD OF THE INVENTION

The present invention relates to printing plates comprising a substrate and a radiation-absorptive layer, wherein the radiation absorptive layer comprises at least one modified pigment product.

DESCRIPTION OF THE RELATED ART

Printing plates are used in several areas of image reproduction, including lithographic printing (also known as offset or planographic printing), flexographic printing, and gravure printing (also called intaglio or rotogravure). In general, the printing process involves the development of an image on the plate followed by exposure to an ink.

Lithographic printing plates are among the most widely used for making printed copies. Generally, an infrared or near-infrared laser-imageable lithographic printing plate includes at least the following layers: paper, a grained-metal, or polyester plate or sheet-like substrate and a radiation-absorptive layer coated thereon. Protective layers for the substrate or the surface of the coated plate may also be used. When coated onto the substrate, this protective layer can also serve as an adhesion-promoting primer. Other layers may be used, for example, to improve adhesion between layers and durability of the printing plate.

In general, the radiation-absorptive layer comprises a photothermal conversion material capable of interacting with the imaging radiation and a polymeric resin or binder. In the imaging process, regions of the plate are selectively exposed to a laser output or other heat source capable of removing or chemically modifying the radiation-absorbent layer. Typically, heat sensitive lithographic printing plates are exposed to radiation having wavelengths of between 800 and 1200 nm. The laser output will define a pattern on the printing plate and either remove or chemically or physically modify only those regions of the radiation-absorptive layer which define the pattern. Afterwards, the printing plate can be further developed by subjecting it to a solvent capable of removing the exposed region(s), if any remains, which define the pattern or, if desired, the plate can be developed such that the non-exposed region(s) are removed. The details of the various conventional components and techniques for such printing plates are described in U.S. Pat. Nos. 5,493,971; 5,705,308; EP 0 803 771 A1; EP 0 770 494 A2; EP 0 770495 A1; as well as PCT Publications WO 96/20429 and WO 98/31550 and the patents set forth therein, all of which are incorporated in their entirety by reference herein.

Several types of polymers have been used in the radiation-absorptive layer. Representative polymers include polyurethanes, poly(vinyl alcohol), polyacrylates, polystyrene, styrene-acrylate polymers, metal oxide polymers, epoxy resins, and phenolic polymers. In addition, phenolic polymers have long been shown to be useful in photoresist applications.

The photothermal conversion material can be either a pigment or a dye. For example, UV- and IR-active dyes have been disclosed in phenolic printing plate applications (see WO 97/39894). IR-absorptive pigments such as carbon black have also been shown to be useful in a lithographic printing plate (see, for example, WO 99/08157, WO 96/20429, WO 99/11458, and U.S. Pat. No. 6,060,218 in which carbon black is present in a phenolic polymer).

Carbon blacks that have been modified to have carboxylate or sulfonate functionalities have also been disclosed for use in lithographic printing plates. For example, see WO 99/04974, WO 99/19143, WO 99/19144, WO 99/37482, and WO 99/37481. However, none of these disclose the use of these modified carbon blacks in a phenolic polymer nor do they disclose the use of other modified pigment products.

Other materials have also been studied as photothermal conversion materials in phenolic polymers. For example, in the photoresist area, soluble compounds containing an S═O or C═O bond have been shown to act as dissolution inhibitors of phenolic resins (Yan and Reiser, *Macromolecules* 1998, 31, 7723). When a phenolic polymer composition containing a photothermal conversion material bearing such a group is irradiated with UV light, the hydrogen bonding network of the phenol groups is disrupted. The irradiated regions thus become soluble in alkaline developing solutions.

PCT Publication WO 00/16987 discloses an imaging member comprising at least one heat-sensitive polymer and a photothermal conversion material, such as a dye or pigment. They polymer is capable of undergoing a transformation from a hydrophilic to a hydrophobic state, or vice versa. No modified pigment product, particularly those that can undergo a chemical transformation, is disclosed.

Pigments such as carbon black are broad band radiation absorbers and, as such, offer an improvement in performance over dyes. However, the effectiveness of pigments such as carbon black as a photothermal conversion material in a printing plate is dependent on the dispersibility of the pigment in the polymer. Thus, there is a need for printing plates comprising pigments such as carbon black with improved dispersibility in polymers used to produce printing plates.

SUMMARY OF THE INVENTION

The present invention relates to printing plates comprising a substrate and a radiation-absorptive layer, wherein the radiation-absorptive layer comprises at least one modified pigment product comprising a pigment having attached at least one organic ionic group and at least one amphiphilic counterion.

The present invention further relates to printing plates comprising a substrate and a radiation-absorptive layer, wherein the radiation-absorptive layer comprises at least one modified pigment product and a phenolic polymer. The modified pigment product comprises a pigment having attached at least one organic group.

The present invention further relates to printing plates comprising a substrate and a radiation-absorptive layer, wherein the radiation-absorptive layer comprises a polymer and at least one modified pigment product comprising a pigment having attached at least one organic group represented by the formula $-X-Sp-[A]_pR$, wherein X, which is directly attached to the pigment, represents an arylene, heteroarylene, or alkylene group, Sp represents a spacer group, A represents an alkylene oxide group of from about 1 to about 12 carbons, p is an integer of from 1 to 500, and R represents hydrogen, a substituted or unsubstituted alkyl group, or a substituted or unsubstituted aryl group, wherein A can be the same or different when p is greater than 1. Preferably, the polymer is a phenolic polymer or an acrylic polymer.

The present invention further relates to printing plates comprising a substrate and a radiation-absorptive layer, wherein the radiation-absorptive layer comprises at least one modified pigment product comprising a pigment having attached at least one organic group represented by the formula -X-Sp-[Vinyl]R, wherein X, which is directly attached to the pigment, represents an arylene, heteroarylene, or alkylene group, Sp represents a spacer group, Vinyl represents an acrylic or styrenic homo- or copolymer comprising repeating substituted or unsubstituted acrylic or styrene monomer units, and R represents hydrogen, a bond, a substituted or unsubstituted alkyl group, or a substituted or unsubstituted aryl group.

The present invention further relates to printing plates comprising a substrate and a radiation-absorptive layer, wherein the radiation-absorptive layer comprises and at least one modified pigment product comprising a pigment having attached at least one organic group represented by the formula -X-Sp-[EI]R, wherein X, which is directly attached to the pigment, represents an arylene, heteroarylene, or alkylene group, Sp represents a spacer group, EI represents an alkyleneimine-based polymer or copolymer, and R represents hydrogen, a bond, a substituted or unsubstituted alkyl group, or a substituted or unsubstituted aryl group.

The present invention further relates to printing plates comprising a substrate and a radiation-absorptive layer, wherein the radiation-absorptive layer comprises at least one modified pigment product comprising a pigment having attached at least one organic group represented by the formula -X-Sp-[SMA]R, wherein X, which is directly attached to the pigment, represents an arylene, heteroarylene, or alkylene group, Sp represents a spacer group, SMA represents a styrene-maleic anhydride polymer or a derivative of a styrene-maleic anhydride polymer, and R represents hydrogen, a bond, a substituted or unsubstituted alkyl group, or a substituted or unsubstituted aryl group.

The present invention further relates to printing plates comprising a substrate and a radiation-absorptive layer, wherein the radiation-absorptive layer comprises at least one modified pigment product comprising a pigment that is at least partially coated with one or more polymeric coatings.

The present invention further relates to a method of imaging the printing plates of this invention.

It is to be understood that both the foregoing general description and the following detailed description are exemplary and explanatory only and are intended to provide further explanation of the present invention, as claimed.

DETAILED DESCRIPTION OF THE INVENTION

The present invention relates to printing plates comprising a substrate and a radiation-absorptive layer comprising at least one modified pigment product.

Printing plates, in general, include both a substrate and a radiation-absorptive layer. Other layers may also be included. In the imaging process, selected regions of the plate are exposed to radiation that is capable of either removing a portion of the radiation-absorptive layer or physically or chemically modifying this layer so that it can interact differently with a developing agent than the unexposed regions. Alternatively, the wetting character of the original coating is inverted upon irradiation. In this way, hydrophilic (or ink-repelling) regions or hydrophobic (or ink-loving) regions are produced, thus defining the image.

Several types are substrates are useful for the present invention and are known to those skilled in the art. Preferred substrates include paper, hydrophilic metals such as aluminum, particularly anodized or grained anodized aluminum, as well as polymers such as polyesters, and, in particular, polyethylene terephthalate. However, other types of substrates can also be used.

In general, a radiation-absorptive layer comprises a photothermal conversion material and a polymer or resin. The radiation-absorptive layer of the present invention comprises a modified pigment product and an optional polymer, for example a phenolic or acrylic polymer.

Several pigment types are useful in the present invention. The pigments to be modified can be, but are not limited to, pigments traditionally used in ink compositions (including inkjet ink compositions), coating compositions (including paint formulations), liquid and solid toners, films, plastics, rubbers, and the like. Examples include, but are not limited to, black pigments (e.g., carbon products such as carbon black) and other colored pigments (e.g., polymeric and organic pigments).

Examples of suitable carbon products include, but are not limited to, graphite, carbon black, vitreous carbon, carbon fibers, activated charcoal, and activated carbon. The carbon may be of the crystalline or amorphous type. Finely divided forms of the above are preferred; also, it is possible to utilize mixtures of different carbons. Any surface area can be used. Of the carbon products, carbon black is most preferred.

The pigments to be modified may be chosen from a wide range of conventional colored pigments. Preferably, the pigment is a white pigment, a black pigment, a blue pigment, a brown pigment, a cyan pigment, a green pigment, a violet pigment, a magenta pigment, a red pigment, or a yellow pigment, or shades or combinations thereof Suitable classes of colored pigments include, for example, anthraquinones, phthalocyanine blues, phthalocyanine greens, diazos, monoazos, pyranthrones, perylenes, heterocyclic yellows, quinacridones, and (thio)indigoids. Representative examples of phthalocyanine blues include copper phthalocyanine blue and derivatives thereof (Pigment Blue 15). Representative examples of quinacridones include Pigment Orange 48, Pigment Orange 49, Pigment Red 122, Pigment Red 192, Pigment Red 202, Pigment Red 206, Pigment Red 207, Pigment Red 209, Pigment Violet 19 and Pigment Violet 42. Representative examples of anthraquinones include Pigment Red 43, Pigment Red 194 (Perinone Red), Pigment Red 216 (Brominated Pyanthrone Red) and Pigment Red 226 (Pyranthrone Red). Representative examples of perylenes include Pigment Red 123 (Vermillion), Pigment Red 149 (Scarlet), Pigment Red 179 (Maroon), Pigment Red 190 (Red), Pigment Violet, Pigment Red 189 (Yellow Shade Red) and Pigment Red 224. Representative examples of thioindigoids include Pigment Red 86, Pigment Red 87, Pigment Red 88, Pigment Red 181, Pigment Red 198, Pigment Violet 36, and Pigment Violet 38. Representative examples of heterocyclic yellows include Pigment Yellow 1, Pigment Yellow 3, Pigment Yellow 12, Pigment Yellow 13, Pigment Yellow 14, Pigment Yellow 17, Pigment Yellow 65, Pigment Yellow 73, Pigment Yellow 74, Pigment Yellow, Pigment Yellow 117, Pigment Yellow 128 and Pigment Yellow 138. Such pigments are commercially available in either powder or press cake form from a number of sources including, BASF Corporation, Engelhard Corporation and Sun Chemical Corporation. Examples of other suitable colored pigments are described in the *Colour Index,* 3rd edition (The Society of Dyers and Colourists, 1982). Representative examples of black pigments include various carbon blacks (Pigment Black 7) such as channel blacks, furnace blacks and lamp blacks, and include, for example, carbon blacks sold under the Regal®, Black Pearls®, Elftex®, Monarch®, Mogul®, and Vulcan® trademarks available from Cabot Corporation (such as Black Pearls® 2000, Black Pearls® 1400, Black Pearls® 1300, Black Pearls® 1100, Black Pearls® 1000, Black Pearls® 900, Black Pearls® 880, Black Pearls® 800, Black Pearls® 700, Black Pearls® L, Elftex® 8, Monarch® 1400, Monarch®1300, Monarch® 1100, Monarch® 1000, Monarch® 900, Monarch® 880, Monarch® 800, Monarch® 700, Mogul® L, Regal® 330, Regal® 400, Vulcan® P). Other suitable carbon blacks include, but are not limited to, Printex 40, Printex 80, Printex 300, Printex L, Printex U, Printex V, Special Black 4, Special Black 5, FW200, (the foregoing available from Degussa Corporation), Raven 780, Raven 890, Raven 1020, Raven 1040, Raven 1255, Raven 1500, Raven 5000, Raven 5250 (the foregoing available from Columbian Chemical Corporation) and MA100 and MA440 available from Mitsubishi Chemical Corporation. The colored pigment will typically have a wide range of BET surface areas, as measured by nitrogen adsorption. Preferably, the colored pigment has a surface area equal or greater than 10 $m^2/g$, and more preferably equal or greater than and 100 $m^2/g$, thereby corresponding to a smaller primary/aggregate particle size. Such surface areas have been found to provide for a more uniform distribution and efficient level of treating agent on the surface of the pigment and a higher percent yield of the surface-modified colored pigment after post processing techniques. If the preferred higher surface area of the colored pigment (thereby corresponding to a smaller particle size) is not readily available, it is well recognized by those skilled in the art that the colored pigment may be subject to conventional size comminution or reduction techniques, such as ball or jet milling, to reduce the pigment to the desired particle size.

The amount of pigment used is dependent on the desired performance of the radiation-absorptive layer. Preferably, the pigment is present in an amount ranging from about 1 to about 50%, and more preferably from about 10–40%.

The modified pigment product used in the printing plates of the present invention preferably comprises a pigment having attached at least one organic group. The pigments are modified using methods known to those skilled in the art such that chemical groups (e.g., polymeric and organic) are attached to the pigment, which provides a more stable attachment of the groups onto the pigment compared to adsorbed groups, e.g., polymers, surfactants, and the like. For example, the modified pigment products of the present invention can be prepared using the methods described in U.S. Pat. Nos. 5,554,739, 5,851,280, 6,042,643, 5,707,432, and 5,837,045, and PCT Publication WO 99/23174, the descriptions of which are fully incorporated herein by reference.

The attached organic group is chosen depending on the type of polymer used in the radiation absorptive layer as well as the method of imaging. This allows for greater flexibility by tailoring the pigment to the specific application.

In one embodiment, the organic group comprises an ionic group, an ionizable group, or a mixture of an ionic group and an ionizable group. An ionic group is either anionic or cationic and is associated with a counterion of the opposite charge including inorganic or organic counterions such as $Na^+$, $K^+$, $Li^+$, $NH_4^+$, $NR'_4{}^+$ acetate, $NO_3^-$, $SO_4^{-2}$, $OH^-$, and $Cl^-$, where R' represents hydrogen or an organic group such as a substituted or unsubstituted aryl and/or alkyl group. An ionizable group is one that is capable of forming an ionic group in the medium of use. Thus, in a preferred embodiment, the organic group is an organic ionic group. Organic ionic groups include those described in U.S. Pat. No. 5,698,016, the description of which is fully incorporated herein by reference.

Negatively charged organic ionic groups may be generated from groups having ionizable substituents that can form anions, such as acidic substituents, or may be the anion in the salts of ionizable substituents. Preferably, when the ionizable substituent forms an anion, the ionizable substituent has a pKa of less than 11. The organic ionic group could further be generated from a species having ionizable groups with a pKa of less than 11 and salts of ionizable substituents having a pKa of less than 11. The pKa of the ionizable substituent refers to the pKa of the ionizable substituent as a whole, not just the acidic substituent. More preferably, the pKa is less than 10 and most preferably less than 9.

Representative examples of ionic groups include $—COO^-$, $—SO_3^-$, $—HPO_3^-$, and $—PO_3^{-2}$. Representative examples of ionizable groups include —COOH, $—SO_3H$, $—PO_3H_2$, $—SO_2NH_2$, and $—SO_2NHCOR'$, where R' represents hydrogen or an organic group such as a substituted or unsubstituted aryl and/or alkyl group. Particularly preferred species are $—COO^-$ and $—SO_3^-$. Preferably, the organic ionic group is generated from a substituted or unsubstituted carboxyphenyl group or a substituted or unsubstituted sulfophenyl group. Specific organic ionic groups are $—C_6H_4CO_2^-$ and $—C_6H_4SO_3^-$.

Positively charged organic ionic groups may be generated from protonated amines which are attached to the pigment. Preferably, an organic group having an amine substituent has a pKb of less than 5. Positively charged organic ionic group may be quaternary anmmonium groups ($—NR'_3{}^+$) and quaternary phosphonium groups ($—PR'_3{}^+$), where R' represents hydrogen or an organic group such as a substituted or unsubstituted aryl and/or alkyl group. For example, amines may be protonated to form ammonium groups in acidic media. Quaternized cyclic ammonium ions, and quaternized aromatic ammonium ions, can also be used as the organic ionic group. Thus, N-substituted pyridinium species, such as N-methyl-pyridyl, can be used in this regard. Examples of cationic organic groups include, but are not limited to, $-3-C_5H_4N(C_2H_5)^+$, $-3-C_5H_4N(CH_3)^+$, $-3-C_5H_4N(CH_2C_6H_5)^+$, $—C_6H_4(NC_5H_5^+)$, $—C_6H_4COCH_2N(CH_3)_3^+$, $—C_6H_4COCH_2(NC_5H_5)^+$, $—C_6H_4SO_2NH(C_4H_3N_2H^+)$, $—C_6H_4CH_2N(CH_3)_3^+$, $—C_6H_4NH_3^+$, $—C_6H_4NH_2(CH_3)^+$, $—C_6H_4NH(CH_3)_2^+$, $—C_6H_4N(CH_3)_3^+$, $—C_6H_4CH_2NH_3^+$, $—C_6H_4CH_2NH_2(CH_3)^+$, $—C_6H_4CH_2NH(CH_3)_2^+$, $—C_6H_4CH_2N(CH_3)_3^+$, $—C_6H_4CH_2CH_2NH_3^+$, $—C_6H_4CH_2CH_2NH_2(CH_3)^+$, $—C_6H_4CH_2CH_2NH(CH_3)_2^+$ and $—C_6H_4CH_2CH_2N(CH_3)_3^+$. Other substituted or unsubstituted arylene or heteroarylene groups can be used in the place of the $C_6H_4$ groups shown in the structures above. Preferably, the cationic organic group is $—NR'_3{}^+$ wherein R' is an alkyl group or an aryl group. Another preferred group is $—C_5H_4N—R'^+$, wherein R' is an alkyl group such as a methyl group or a benzyl group.

In another embodiment, the printing plates of the present invention comprise a substrate and a radiation-absorptive layer which comprises a modified pigment product comprising a pigment having attached at least one organic ionic group and at least one amphiphilic counterion. The amphiphilic counterion is a molecule having a hydrophilic polar "head" and a hydrophobic organic "tail." Representative examples of cationic and anionic amphiphilic counterions include those set forth and described in U.S. Pat. No. 5,698,016 to Adams et al., the entire description of which is incorporated herein by reference.

The amphiphilic counterion of the present invention has a charge opposite to that of the organic ionic group. Thus, if the modified pigment product is anionic, then the amphiphilic counterion will be cationic or positive charging. Similarly, if the modified pigment product is cationic, then the amphiphilic counterion will be anionic or negative charging.

Examples of cationic amphiphilic counterions include, but are not limited to, those described ammonium ions that may be formed from adding acids to the following: a fatty amine, an ester of an aminoalcohol, an alkylamine, a polymer containing an amine functionality, a polyethoxylated amine, a polypropoxylated amine, a polyethoxylated-polypropoxylatedamine, an aniline and derivatives thereof, a fatty alcohol ester of amino acid, a polyamine N-alkylated with a dialkyl succinate ester, a heterocyclic amine, a guanidine derived from a fatty amine, a guanidine derived from an alkylamine, a guanidine derived from an arylamine, an amidine derived from a fatty amine, an amidine derived from a fatty acid, an amidine derived from an alkylamine, or an amidine derived from an arylamine. The pKa of the ammonium ion is preferably greater than the pKa of the protonated form of the organic ionic group on the pigment.

Generally, to form the ammonium ions described above, the various compounds described above such as fatty amines, esters of amino alcohols, etc., are reacted with an acid such as carboxylic acid, a mineral acid, an alkyl sulfonic acid, or an aryl sulfonic acid. Preferred amphiphilic groups include ammonium ethoxylates, ammonium propoxylates ammonium ethoxylatepropoxylates. They may be prepared from the corresponding amino ethoxylates and the like, including Jeffamine materials supplied by Huntsman Chemical and aminoalkylarylpropoxylates supplied by Triquest.

Quaternary ammonium salts can also be used as the sources of the cationic amphiphilic counterion. Examples include, but are not limited to, a fatty alkyl trimethyl ammonium, a di(fatty alkyl)dimethylammonium, an alkyl trimethyl ammonium, or 1-alkyl pyridinium salt, where the counterion is a halide, methosulfate, sulfonate, a sulfate or the like. Also, phosphonium salts, such as tetraphenylphosphonium chloride can be used as the sources of the amphiphilic counterion.

Cationic amphiphilic counterions for use in the present invention include those represented by the formula $R''_4N^+$, wherein R" is independently hydrogen, a substituted or unsubstituted alkyl group, a substituted or unsubstituted aryl group, a substituted or unsubstituted alkaryl group, a substituted or unsubstituted aralkyl group, or a substituted or unsubstituted alkylene group. Examples include, but are not limited to, $C_1$–$C_{30}$ alkyl, $C_1$–$C_{30}$ alkenyl, $C_7$–$C_{30}$ aralkyl, and $C_7$–$C_{30}$ alkaryl. Preferably, the cationic amphiphilic counterion is benzyltrialkylammonium.

Another example of a suitable amphiphilic counterion is a polymer containing an ammonium ion derived from an amine containing polymer. The amine containing polymer can be a copolymer of an amine containing monomer, such as dimethylaminoethyl methacrylate or -acrylate, or vinylpyridine or vinylimidazole, and another monomer such as methyl acrylate, methyl methacrylate, butyl acrylate, styrene, and the like. The polymer may also be a ter- or tetra-polymer containing a mixture of an amine containing monomer and two or three other amine containing monomers, respectively. The polymer may also be an alkyleneimine polymer or derivative, such as polyethyleneimine (PEI), ethoxylated PEI, hydroxypropylated PEI, epichlorohydrin-modified PEI, and acylated PEI. These polymers may be prepared by any means known in the art, such as radical (emulsion, suspension, or solution), anionic, or cationic polymerization.

As stated earlier, the amphiphilic counterion can alternatively be an anionic amphiphilic ion. Examples of such anionic amphiphilic counterions include, but are not limited to, an alkylbenzene sulfonate, an alkyl sulfonate, an alkylsulfate, a sulfosuccinate, a sarcosine, an alcohol ethoxylate sulfate, an alcohol ethoxylate sulfonate, an alkyl phosphate, an alkylethoxylated phosphate, an ethoxylated alkylphenol sulfate, a fatty carboxylate, a taurate, an isethionate, an aliphatic carboxylate, or an ion derived from a polymer containing an acid group. Sources of specific and preferred examples of anionic amphiphilic ions include, but are not limited to, sodium dodecylbenzene sulfonate, a sodium dodecylsulfate, Aerosol OT, an oleic acid salt, a ricinoleic acid salt, a myrisitic acid salt, a caproic acid salt, sodium 2-octyldodecanoate, or sodium bis(2-ethylhexyl)sulfosuccinate.

In addition, the anionic amphiphilic counterion can be a polymer containing anionic groups. Examples include sulfonated or carboxylated styrene polymers, homo- or copolymers of acrylic acid or methacrylic acid or salts thereof, or homo- or copolymers of maleic acid or salts thereof. These polymers can contain comonomers such as acrylic or methacrylic esters (for example, methyl methacrylate, ethyl acrylate, or butyl acrylate), acrylonitrile, and vinyl acetate.

Generally, the above-identified amphiphilic ions and related compounds are commercially available in salt form or can be routinely made by one of ordinary skill in the art.

The modified pigment products comprising at least one organic ionic group and at least one amphiphilic counterion may be prepared by the reaction of the modified pigment particle having an organic ionic group, with the salt of an amphiphile. For instance, an aqueous dispersion of an anionically modified carbon black can be combined with an amine containing compound and one or more equivalents of an acid; or can be combined with a quaternary ammonium salt; or can be combined with an amine containing polymer and one or more equivalents of an acid. Alternatively, a cationically modified carbon black can be combined with an anionic amphiphile. The resulting products, whether anionic or cationic in nature, may be purified by washing, such as by filtration, to remove unreacted raw materials, byproduct salts and other reaction impurities. The products can also be isolated, for example, by evaporation or it may be recovered by filtration and drying using known techniques to those skilled in the art.

Alternatively, an aqueous dispersion of the modified carbon black or pigment particle, as its free acid, may be combined with an amine containing amphiphile. In this way the modified carbon product protonates the amine, thus forming ions from each of the two components. The complimentary case may be useful for a modified carbon black bearing a free base with an acidic amphiphilic compound.

In addition, the modified carbon black or pigment particle having attached ionic groups may further be prepared using known techniques to those skill in the art, such as by adding the modified carbon black or pigment particle to a continuously operating pin mixer with an amphiphilic ion of the opposite charge in an aqueous solution. Alternatively, the carbon black or pigment particle, the reagents for attaching the organic ionic group to the carbon black or pigment particle, and an amphiphilic ion source may be added simultaneously in a suitable batch or continuous mixer. The resultant material is optionally purified and subsequently dried for use in such applications as toner and developer applications.

Through these processes, it will be recognized that the amount of amphiphilic counterion present need not be equivalent to the amount of charged groups of the modified pigment. However, when the amount of amphiphilic counterion is high, the amphiphile can, in essence, become a coating on the modified pigment. Thus, by proper choice of the amount and type of amphiphilic counterion, it is possible to partially or fully encapsulate the modified pigment product.

An amphiphilic counterion that contains more than one charged group can also be used for the modified pigment products used in the printing plates of the present invention. Such an amphiphile is typically polymeric. When a polyfunctional amphiphile is used, it is possible that not all of the charged groups become ionically bonded to the modified pigment. An excess of these charged groups may be present. Thus, use of a polyfunctional amphiphilic counterion can result in a pigment with a charge that is opposite to that of the initial modified pigment product. For example, a pigment product modified with an anionic group can become cationic in nature if an excess of a polycationic amphiphilic counterion is used. Again, a partially or fully encapsulated product can also result.

The organic group attached to the modified pigment products used in the printing plates of the present invention may also be polymeric. The attached polymer groups may be present as individual attached chains or as a coating on the pigment, as is described below.

In one embodiment, the modified pigment products comprise a pigment having attached at least one organic group represented by the formula -X-Sp-$[A]_p$R. A represents an alkylene oxide group of from about 1 to about 12 carbons, p is an integer from 1 to 500, and R represents hydrogen, a substituted or unsubstituted alkyl group, or a substituted or unsubstituted aryl group. A can be the same or different when p is greater than 1. Examples of preferred alkylene oxide groups include, but are not limited to, $—CH_2—CH_2—O—$; $—CH(CH_3)—CH_2—O—$; $—CH_2—CH(CH_3)—O—$, $—CH_2CH_2CH_2—O—$, or combinations thereof.

The group Sp represents a spacer group as discussed above. Spacer group, as used herein, is a link between two groups and can be a bond or a chemical group. Examples of chemical groups include, but are not limited to, $—CO_2—$, $—O_2C—$, —CO—, $—OSO_2—$, $—SO_3—$, $—SO_2—$, $—SO_2C_2H_4O—$, $—SO_2C_2H_4S—$, $—SO_2C_2H_4NR—$, —O—, —S—, —NR—, —NRCO—, —CONR—, $—NRCO_2—$, $—O_2CNR—$, —NRCONR—, $—NRCOCH(CH_2CO_2R)—$, $—NRCOCH_2CH(CO_2R)—$, —N(COR)(CO)—, imide groups, arylene groups, alkylene groups and the like. R, which can be the same or different, represents hydrogen or an organic group such as a substituted or unsubstituted aryl or alkyl group, and p is an integer from 1–10.

The group X represents an arylene, heteroarylene, or alkylene group. X is directly attached to the pigment. The aromatic group can be further substituted with any group, such as one or more alkyl groups or aryl groups. Preferably, the arylene or heteroarylene group is phenylene, naphthylene, or biphenylene. When X represents an alkylene group, examples include, but are not limited to, substituted or unsubstituted alkylene groups which may be branched or unbranched. The alkylene group can be substituted with one or more groups, such as aromatic groups. Preferred examples include, but are not limited to, $C_1$–$C_{12}$ groups like methylene, ethylene, propylene, and butylene groups. Preferably, X is an arylene group.

The group X may be substituted with one or more functional groups. Examples of functional groups include, but are not limited to, R''', OR''', COR''', COOR''', OCOR''', carboxylates, halogens, CN, $NR'''_2$, $SO_3H$, sulfonates, $—OSO_3$, NR'''(COR'''), $CONR'''_2$, $NO_2$, $PO_3H_2$, phosphonates, phosphates, N═NR''', SOR''', $NSO_2R'''$, wherein R''' which can be the same or different, is independently hydrogen, branched or unbranched $C_1$–$C_{20}$ substituted or unsubstituted, saturated or unsaturated hydrocarbons, e.g., alkyl, alkenyl, alkynyl, substituted or unsubstituted aryl, substituted or unsubstituted heteroaryl, substituted or unsubstituted alkaryl, or substituted or unsubstituted aralkyl.

In another embodiment, the modified pigment products used in the printing plates of the present invention comprise a pigment having attached at least one organic group represented by the formula -X-Sp-[Vinyl]R. X and Sp are as described above, and R represents hydrogen, a bond, a substituted or unsubstituted alkyl group, or a substituted or unsubstituted aryl group. Vinyl represents an acrylic or styrenic homo- or copolymer comprising repeating substituted or unsubstituted acrylic or styrene monomer units. Preferably at least some of these monomer units comprise an ionic group, an ionizable group, or a mixture of ionic or ionizable groups. Examples of preferred Vinyl groups include homo- and copolymers of acrylic or methacrylic acid, homo- and copolymers of acrylic or methacrylic esters, styrene-acrylate polymers, sulfonated or carboxylated styrene-acrylic polymers, and ethylene-acrylic acid polymers. Also preferred are acrylic or methacrylic acid homo- and copolymers or salts thereof with counterions such as $Na^+$, $K^+$, $Li^+$, $NH_4^+$, $NR'_4{}^+$ where R' represents hydrogen or an organic group such as a substituted or unsubstituted aryl and/or alkyl group. The total number of monomer repeating units that comprise the group Vinyl is preferably not greater than about 500.

In another embodiment, the modified pigment products used in the printing plates of the present invention comprise a pigment having attached at least one organic group represented by the formula -X-Sp-[EI]R. X and Sp are as described above, and R represents hydrogen, a bond, a substituted or unsubstituted alkyl group, or a substituted or unsubstituted aryl group. The group EI represents an alkyleneimine-based polymer or copolymer. Examples include polyethyleneimine (PEI), derivatives of PEI, such as ethoxylated PEI, hydroxypropylated PEI, epichlorohydrin-modified PEI, and acylated PEI, and PEI salts made protonation or alkylation, with counterions such as acetate, $NO_3^-$, $SO_4^-$ 2, $OH^-$, and $Cl^-$. Preferably EI is polyethyleneimine. The total number of monomer repeating units that comprise the group EI is preferably not greater than about 500.

In another embodiment, the modified pigment products used in the printing plates of the present invention comprise a pigment having attached at least one organic group represented by the formula -X-Sp-[SMA]R. X and Sp are as described above, and R represents hydrogen, a bond, a substituted or unsubstituted alkyl group, or a substituted or unsubstituted aryl group. SMA represents a styrene-maleic anhydride polymer or a derivative of a styrene-maleic anhydride polymer such as an ester, amide, imide, and a partially esterified or amidized material with a residual carboxylic acid group or salt thereof with a counterion such as $Na^+$, $K^+$, $Li^+$, $NH_4^+$, $NR'_4{}^+$ where R' represents hydrogen or an organic group such as a substituted or unsubstituted aryl and/or alkyl group. Preferably at least some of these monomer units comprise an ionic group, an ionizable group, or a mixture of ionic or ionizable groups. Examples include sulfonated or carboxylated styrene units and hydrolyzed maleic anhydride units (maleic acid units). The total number of monomer repeating units that comprise the group SMA is preferably not greater than about 500.

As shown by the structures above, Vinyl, EI, and SMA are attached to the pigment through the spacer group Sp. However, it will also be recognized that when R represents a bond, the available bond can also be attached to the pigment. In addition, Vinyl, EI, and SMA can also be attached to the pigment at multiple points along the polymer chain through proper choice of substituent groups on the repeating monomer units. These substituents may also comprise spacer groups or -X-Sp- groups as described above. Thus, these groups can be attached to the pigment at either end or at points along the backbone. Further, these groups can be any type of polymeric group, such as a random polymer, alternating polymer, graft polymer, block polymer, star-like polymer, and/or comb-like polymer.

The polymeric groups of the present invention can be prepared in a number of ways and such ways are known to those skilled in the art.

The amount of polymer present on the modified pigments can be high enough to cover a substantial amount of the pigment. Thus, in another embodiment, the modified pigment products used in the printing plates of the present invention comprise a pigment that is at least partially coated with one or more polymeric coatings and can be substantially or fully coated by one or more polymers. The use of the term "coated" includes both partially and fully coated pigments and modified pigments—the polymer partially or fully encapsulates the modified pigment, wherein the modified pigment is the core and the polymer is the shell. The polymer(s) coated onto or used to encapsulate the modified pigment is preferably present on the modified pigment such that the polymer(s) is not substantially extractable by an organic solvent. More preferably, the polymer(s) on the modified pigment is attached by physical (for example, adsorption) and/or chemical means (for example, bonding or grafting).

The modified pigment can have more than one coating or shell. In other words, the modified pigment can have multiple layers or shells or coatings which partially or fully encapsulate the modified pigment or a previous coating or shell. The polymers comprising the various layers can be the same or different. For instance, one layer can be cross-linked while the next layer can be not cross-linked. Each of the various coatings, if more than one is present on the modified pigment, can be substantially the same or vary in thickness if desired.

The polymer which is coated onto the modified pigment can be a homopolymer, copolymer, terpolymer, and/or a polymer containing any number of different repeating units. The polymer can be any type of polymer, such as a random polymer, alternating polymer, graft polymer, block polymer, star-like polymer, and/or comb-like polymer. The polymer can also be one or more polyblends. The polymer can be an interpenetrating polymer network (IPN), simultaneous interpenetrating network (SIN), or interpenetrating elastomeric network (IEN). The polymer can be thermoplastic or thermosettable.

Specific examples of polymers include, but are not limited to, linear and non-linear polymers such as polyethylene, poly(vinyl chloride), polyisobutylene, polystyrene, polycaprolactam (nylon), polyisoprene, and the like. Other general classes of polymers include polyamides, polycarbonates, polyelectrolytes, polyesters, polyethers, polysulfides, polyolefins, acrylic and methacrylic polymers, halogenated polymers (such as polyvinyl chloride, polyvinylidene chloride, and fluoropolymers), and the like. Preferably, the polymer is an acrylic polymer, a methacrylic polymer, or a styrenic polymer, but would largely depend upon the intended plate construction.

The polymer coated modified pigment particles can be made by a number of ways. Preferably, the modified pigments are made by, but are not limited to, aqueous mediated polymerization environments such as emulsion polymerization or suspension polymerization processes as well as solvent based polymerizations. The polymerizations involved are generally chain growth polymerizations and/or step growth polymerizations.

Further details concerning the polymer coated pigments and methods of making them are set forth in International Published Application No. WO 00/22051, incorporated in its entirety by reference herein.

The amount of attached organic groups useful in the printing plates of the present invention can be varied in order to attain desired performance attributes, such as dispersibility in the polymeric resin or binder. In addition, modified pigment products comprising multiple attached organic groups can result in improved properties. In general, the amount of attached organic groups is from about 0.001 to about 10.0 micromoles of organic group per $m^2$ surface area of pigment, as measured by nitrogen adsorption (BET method). Preferably, the amount of attached organic groups is between from about 0.005 to about 4.0 micromoles per $m^2$.

The pigment products may be purified by washing, such as by filtration, centrifugation, or a combination of the two methods, to remove unreacted raw materials, byproduct salts and other reaction impurities. The products may also be isolated, for example, by evaporation or it may be recovered by filtration and drying using known techniques to those skilled in the art. Dispersions of the pigments of the present invention may be further purified or classified to remove impurities and other undesirable free species which can co-exist in the dispersion as a result of the manufacturing process. In a preferred embodiment, the pigment dispersions are subject to a classification step, such as centrifugation, to substantially remove particles having a size above about 1.0 micron, preferably above about 0.5 micron. In addition, the dispersion is preferably purified to remove any undesired free species, such as unreacted treating agent. Known techniques of ultrafiltration/diafiltration using a membrane or ion exchange may be used to purify the dispersion and remove a substantial amount of free ionic and unwanted species. Also preferred is an optional exchange of counterions whereby the counterions that form a part of the surface-modified pigment are exchanged or substituted with alternative counterions (including, e.g., amphiphilic ions) utilizing known ion exchange techniques such as ultrafiltration, reverse osmosis, ion exchange columns and the like. Particular examples of counterions that can be exchanged include, but are not limited to, $Na^+$, $K^+$, $Li^+$, $NH_4^+$, $Ca^{2+}$, $Mg^{2+}$, $Cl^-$, $NO_3^-$, $NO_2^-$, acetate, and $Br^-$. Such additional classification and purification methods are more fully described in U.S. Pat. No. 6,328,894, the disclosure of which is fully incorporated herein by reference. The removal of impurities from the pigment products may improve their properties when used in printing plates, black matrix materials, proofing materials, or in thermal transfer recording materials, as discussed in more detail below.

The printing plates of the present invention comprise a radiation-absorptive layer that may further comprise a polymeric resin or binder. The polymer is chosen to provide the plate with desirable physical and chemical properties such as flexibility, hardness, and ink compatibility. Several different polymeric systems can be used in the printing plates of the present invention. Examples include, but are not limited to, polyurethanes, vinyl alcohol-containing polymers such as poly(vinyl alcohol), polyacrylates (in particular, polymers comprising acrylic acid, methacrylic acid, or esters or salts thereof), polystyrenes, styrene-acrylate polymers, metal oxide polymers, epoxy resins, and phenolic polymers. Various comonomers can be included into these polymers to further adjust the final properties of the polymeric resin.

A preferred class of polymeric resins or binders is phenolic polymers. Phenolic polymers are polymers comprising substituted or unsubstituted phenol groups and include, for example, homo- and copolymers of 4-hydroxystyrene, homo- and copolymers of 3-methyl-4-hydroxystyrene, homo- and copolymers of 4-methoxystyrene, and copolymers of substituted or unsubstituted phenols. Blends of these phenolic polymers are also useful. Other phenolic polymers will be known to one skilled in the art. Most preferred are phenolic resins which are the condensation products of substituted or unsubstituted phenols such as phenol, cresols, and 4-t-butyl-phenol with aldehydes such as formaldehyde. Of particular use are the novolak resins and the resole resins as well as blends of these resins.

The polymers described above can be produced by any method know to those skilled in the art, including free radical, anionic, cationic, and condensation polymerizations. Polymer properties such as molecular weight are chosen dependent on the desired physical and chemical properties of the final plate. For example, if the molecular weight is too high, this may effect the ability of the final irradiated plate to be developed, for example, in a alkaline medium in which it is desired to have the irradiated areas dissolve. Also, if the molecular weight is too low, the plate may become tacky and difficult to handle.

While not wishing to be bound by any particular theory, it is believed that the modified pigment products described above interact with the polymeric resin or binder, in particular, phenolic polymers, in such a way as to strengthen the hydrogen bonding network of the polymer. This network makes the phenolic polymer insoluble in, for example, aqueous alkaline developing solutions. However, upon irradiation, the hydrogen bonding network is disrupted, enabling at least a portion of the irradiation regions to become soluble in an aqueous alkaline solution. Thus, the modified pigment products act as dissolution inhibitors as well as photothermal agents.

The printing plates of the present invention can be prepared using any method know to those skilled in the art. The modified pigment products described above can be incorporated into the optional polymeric resins or binders using any standard blending technique, including, for example, solvent casting. The modified pigment products can be incorporated either as predispersions in a solvent (aqueous or non-aqueous) as well as in a dried or partially dried powdered state.

A particular advantage of the plates of the present invention is that the modified pigment products can also be designed so as to undergo a chemical transformation upon irradiation. Thus, for example, it is possible to choose an organic group and/or amphiphilic counterion that initially interacts with the hydrogen bonding network of the polymeric resin or binder, in particular a phenolic polymer, and further, upon irradiation, undergoes a chemical transformation which reduces its ability to interact with this hydrogen bonding network. As a further example, a modified pigment product can be prepared in which the organic group undergoes a chemical transformation upon irradiation from ionic to neutral, thus changing the wetting properties of the irradiated regions of the printing plate. As an additional example, a modified pigment product can be prepared in which, upon irradiation, the organic group undergoes a chemical reaction with other components in the radiation absorbing layer, such as the polymer, thus changing the developability of the layer in such as way that the irradiated regions are no longer developable in an alkali solution.

The present invention also relates to a method of imaging a printing plate comprising a radiation-absorptive layer which comprises an optional polymer and at least one modified pigment product which involves selectively exposing the plate to a laser output in a pattern representing an image. The irradiation is done to selectively remove or chemically modify at least a portion of the radiation-absorptive layer that defines the pattern. This method may further involve the development of the irradiated plate using a solvent that is capable of removing portions of the imaged layer(s) defining the pattern. A preferred development solution is an aqueous alkaline solution. For other types of polymeric resins, a developing solution may not be needed. For example, irradiation of the plates of the present invention can also lead to a chemical change from, for example, hydrophobic to hydrophilic, thus producing a plate which has regions that would interact differently with an ink.

The present invention relates to lithographic printing plates, such as infrared or near-infrared laser-imageable printing plates. As described above, an infrared or near-infrared laser-imageable lithographic printing plate includes at least the following layers: a grained-metal, polyester or paper plate or sheet-like substrate and a radiation-absorptive layer coated thereon. In the present invention, the radiation-absorptive layer comprises at least one modified pigment product and an optional polymeric resin or binder. Protective layers for the substrate or the surface of the coated plate may also be used in the present invention. When coated onto the substrate, the protective layer can also serve as an adhesion-promoting primer. Other layers may be used, for example, to improve adhesion between layers and durability of the printing plate. The imaging process is as described above.

Also, the present invention relates to flexographic printing plates, such as infrared or near-infrared laser-imageable printing plates. Generally, an infrared or near-infrared laser-imageable flexographic printing plate includes at least the following layers: a polyester plate or sheet-like substrate, a UV curable layer, and a radiation-absorptive layer coated thereon. In the present invention, the radiation-absorptive layer comprises at least one modified pigment product and an optional polymeric resin or binder. Protective layers for the substrate or the surface of the coated plate may also be used in the present invention. Other layers may be used, for example, to improve adhesion between layers and durability of the printing plate. In the imaging process, a gravure or flexographic printing plate is selectively exposed to a laser output or other source capable of removing or chemically modifying the radiation-absorbent layer or layers adjacent thereto. The laser output will define a pattern on the printing plate and remove or modify only those portions of the radiation-absorptive layer which define the pattern. The plate may be subsequently exposed to UV energy. Afterwards, the printing plate can be further developed by subjecting it to a solvent capable of removing the nonexposed layer(s), if any remains, which defines the same pattern. The details of the various conventional components and techniques for such printing plates are described in European patent application EP 0928685 A2, which is incorporated in its entirety by reference herein.

The present invention further relates to thermal transfer recording materials. Generally, a thermal transfer recording material includes an ink layer, a photothermal layer, and a support. In the present invention, the photothermal layer comprises at least one modified pigment product and an optional polymeric resin or binder. Protective layers for the substrate or the surface of the coated plate may also be used in the present invention. Other layers may be used, for example, to improve adhesion between layers of the recording material or to provide a cushion between layers. In the imaging process, the recording material may be exposed by a laser through the support while the thermal transfer recording material is in contact with a receiving material. The laser output will define a pattern on the recording material and cause an image to be transferred to the receiving material. The details of the various conventional components and techniques for such photothermal recording materials are described in Japanese patent JP10016395A, which is incorporated in its entirety by reference herein. These thermal transfer recording materials may also be used for color proofing in printing systems or they may be used in medical diagnostic systems.

The present invention further relates to other types of proofing materials. Generally, these proofing materials include at least the following layers: a radiation transparent support, a radiation curable layer, and a receiving layer. In the present invention, the radiation curable layer comprises at least one modified pigment product and an optional polymeric resin or binder. Protective layers for the substrate or the surface of the coated plate may also be used in the present invention. Other layers may be used, for example, to improve durability and adhesion between layers of the proofing material. In the imaging process, the proofing material is selectively exposed, through the support, to a laser output or other source capable of causing the curing of the radiation curable layer. The laser output will define a pattern on the proofing material and cure only those portions of the radiation curable layer which define the pattern. Subsequently, the support is removed. The cured image may adhere to the receiving layer and the uncured portions of the radiation curable layer are removed with the support. The details of the various conventional components and techniques for such proofing materials are described in European patent application EP924568 which is incorporated in its entirety by reference herein.

The present invention further relates to a black matrix for color filters. A black matrix is an integral component of an image display, in particular, a liquid crystal display (LCD). Examples of liquid crystal displays include, for example, super twisted nematic (STN) displays and thin film transistor (TFT) displays. Each of these types of liquid crystal displays contains a black matrix element. A black matrix is generally formed by applying a photosensitive coating on a clear substrate, exposing the coating imagewise, developing and drying the coating. In the present invention, the photosensitive coating comprises at least one modified pigment product and a solvent. This may further contain a resin such as a photosensitive resin. The color filter further comprises colored layers. The color layers may be, for example, red, green and yellow, or cyan, magenta and yellow. The details of the various conventional components and techniques for such black matrices are described in Japanese patents JP11062119; JP10300921; JP11006914; JP 11014822 JP 11142639 which are incorporated in their entirety by reference herein.

The present invention will be further clarified by the following examples, which are intended to be purely exemplary of the present invention.

EXAMPLES

Example 1

An aqueous dispersion of a modified carbon black product was prepared. A pin pelletizer was charged with one part of a carbon black with a surface area of 110 $m^2/g$ and a DBPA of 114 mL/100 g. A solution of 0.06 parts of N-(4-aminophenyl)pyridinium nitrite in 0.18 parts of water was added while pelletizer was operating at 600 rpm. An aqueous solution of nitric acid in water (0.8 parts, 22% $HNO_3$) was added and mixing was continued for a few min, to give a product with 0.21 mmol/g of attached p-$C_6H_4(N^+C_5N_5)$ $NO_3^-$ groups. After standing for several days, the product was dispersed in water. Impurities were removed by centrifugation and with diafiltration using water. The resulting dispersion had 12% solids.

A polymer solution was prepared by stirring 20 g of Carboset® 527 acrylic resin (available from B.F. Goodrich, Cleveland, Ohio) with 100 g of water and 1.75 g of 28% aqueous ammonia. Carboset® 527 acrylic resin has a MW of 40,000 and an acid number of 80.

The dispersion of the modified carbon black product (83 g) was added to 50 g of the polymer solution under high shear mixing. The product was purified by removing some solids by centrifugation. The resulting product was a aqueous dispersion of a carbon black product with an attached ionic group and a polymeric counterion.

Example 2

A plow mixer was charged with 1 part of a carbon black with a surface area of 200 $m^2/g$ and a DBPA of 117 mL/100 g, 0.095 parts of N-(4-aminophenyl)pyridinium nitrite, and 1.5 parts of water and operated until the temperature reached 45° C. A solution of 0.039 parts of concentrated nitric acid in 0.35 parts of water was added and mixing was continued for an additional two hours to give a modified carbon black product with 0.31 mmol/g of attached p-$C_6H_4(N^+C_5H_5)$ $NO_3^-$ groups. After standing for several days, the product was dispersed in water. Impurities were removed by centrifugation and with diafiltration using water. The resulting dispersion was diluted with water so it had 15% solids.

A polymer solution was prepared by stirring 20 g of Carboset® 527 acrylic resin (available from B.F. Goodrich, Cleveland, Ohio) with 100 g of water and 1.75 g of 28% aqueous ammonia. Carboset® 527 acrylic resin has a MW of 40,000 and an acid number of 80.

The dispersion of the modified carbon black product (123 g) was added to 61 g of the polymer solution under high shear mixing. After removing some solids by settling, the resulting product was a aqueous dispersion of a carbon black product with an attached ionic group and a polymeric counterion. The product had a zeta potential of −6 mV.

Example 3

A plow mixer was charged with 1 part of a carbon black with a surface area of 200 $m^2/g$ and a DBPA of 117 mL/100g, 0.095 parts of N-(4-aminophenyl)pyridinium nitrite, and 1.5 parts of water and operated until the temperature reached 45° C. A solution of 0.039 parts of concentrated nitric acid in 0.35 parts of water was added and mixing was continued for an additional two hours to give a modified carbon black product with 0.31 mmol/g of attached p-$C_6H_4(N^+C_5H_5)$ $NO_3^-$ groups. After standing for several days, the product was dispersed in water. Impurities were removed by centrifugation and with diafiltration using water. The resulting dispersion was diluted with water so it had 15% solids.

The dispersion of the modified carbon black product (243 g) was added to 184 g of Joncryl® 637 acrylic polymer emulsion under high shear mixing. Joncryl® 637 acrylic polymer emulsion is available from S.C. Johnson, Sturtevant, Wis., and has a MW of 65000, and acid number of 130 and has 20 wt % solids. The product was purified by removing some solids by centrifugation. The resulting product was a aqueous dispersion of a carbon black product with an attached ionic group and a polymeric counterion. The product had a zeta potential of −20 mV.

Example 4

A mixture of 99 g of Cab-O-Jet® 200 carbon black dispersion (available from Cabot Corp., Billerica, Mass.), 1.64 g of azobis[2-(2-imidazolin-2-yl)propane] dihydrochloride, 1.77 g of concentrated $NH_4OH$ and 106 g of water was stirred under a nitrogen atmosphere at 70° C. A mixture of 6.1 g of methylmethacrylate, 10.2 g of ethyl acrylate, and 2.7 g of acrylic acid was added over a period of 1.5 hr. Mixing at 70° C. was continued for an additional 3.5 hr. The resulting product is an aqueous dispersion of a modified carbon black with a polymeric coating.

Example 5

An aqueous dispersion of 34.2 grams of Cab-O-Jet® 300 black dispersion (commercially available from Cabot Corporation, Billerica, Mass.) was reacted with 0.8 grams of ARQUAD® DMHTB quaternary ammonia compound. The carbon flocculated and the carbon black product was isolated by filtration, washed with water, and dried at 70° C. 1.5 grams of the resulting carbon black product were mixed with 25 grams of a solution of 24 wt % a phenolic resin in 1-methoxy-2-propanol and 25 grams of 1-methoxy-2-propanol. The mixture was placed into a Midget mill containing 200 grams of stainless steel shot. The mill was sealed and placed in a paint shaker for 2 hours. Dispersion quality was checked with a Hegeman grind gauge and found to be at least 7 on the gauge scale. The resulting dispersion was coated onto a grained anodized aluminum plate to give a uniform wet coating with a thickness of 25 microns. The coated plate was air dried. The resulting composite could be imaged by selective exposure to infrared radiation (e.g. with a diode laser emitting at 830 or 1064 nm) and could be developed with a sodium silicate developer.

Example 6

Fifteen grams of carbon black having attached carboxylic acid groups were prepared by acidification of 110 grams of Cab-O-Jet® 300 black dispersion (commercially available from Cabot Corporation, Billerica, Mass.). The flocculated black was washed with water to remove excess acid and dried. The carbon black product was mixed into 135 grams of 1-methoxy-2-propanol and then reacted with 1.65 grams of a 40 wt % methanolic solution of benzyltrimethylammonium hydroxide. 34.5 grams of the resulting carbon black dispersion were mixed with 12 grams of a phenolic resin and 3.6 grams of 1-methoxy-2-propanol. The mixture was placed into a Midget mill containing 200 grams of stainless steel shot. The mill was sealed and placed in a paint shaker for 2 hours. Dispersion quality was checked with a Hegeman grind gauge and found to be at least 7 on the gauge scale. The resulting dispersion was coated onto a grained anodized aluminum plate to give a uniform wet coating with a thickness of 25 microns. The coated plate was air dried. The resulting composite could be imaged by selective exposure to infrared radiation (e.g. with a diode laser emitting at 830 or 1064 nm) and could be developed with a sodium silicate developer.

Example 7

With stirring, 33.6 grams of the 15 wt % aqueous carbon black dispersion described in Example 3 were reacted with 0.53 grams of glycolic acid nonaethoxylate oleyl ether. The carbon black product was isolated by filtration, washed with water, and dried at 70° C. 1.5 grams of the resulting carbon black product were mixed with 25 grams of a solution of 24 wt % a phenolic resin in 1-methoxy-2-propanol and 25 grams of 1-methoxy-2-propanol. The mixture was placed into a Midget mill containing 200 grams of stainless steel shot. The mill was sealed and placed in a paint shaker for 2 hours. Dispersion quality was checked with a Hegeman grind gauge and found to be at least 7 on the gauge scale. The resulting dispersion was coated onto a grained anodized aluminum plate to give a uniform wet coating with a thickness of 25 microns. The coating was air dried. The resulting composite could be imaged by selective exposure to infrared radiation (e.g. with a diode laser emitting at 830 or 1064 nm) and could be developed with a sodium silicate developer.

Example 8

To a vigorously stirred 70° C. slurry of 10 grams phthalocyanine blue 15:4 was added 3.6 grams of 4-aminobenzoic acid, 1.2 grams of 70 wt % nitric acid and 1.8 grams of sodium nitrite. The product was purified by dialysis with water to yield a dispersion having 9.8 wt % solids. On a dry basis, the pigment had 0.12 meq/g attached sodium carboxylate groups. 51 grams of the pigment dispersion were reacted with 0.25 grams of ARQUAD® DMHTB quaternary ammonium compound. The pigment product was isolated by filtration, washed with water, and dried at 70° C. 1.5 grams of the resulting phthalocyanine blue pigment product were mixed with 25 grams of a solution of 24 wt % a phenolic resin in 1-methoxy-2-propanol and 25 grams of 1-methoxy-2-propanol. The mixture was placed into a Midget mill containing 200 grams of stainless steel shot. The mill was sealed and placed in a paint shaker for 2 hours. Dispersion quality was checked with a Hegeman grind gauge and found to be at least 7 on the gauge scale. The resulting dispersion was coated onto a grained anodized aluminum plate to give a uniform wet coating with a thickness of 25 microns. The coating was air dried. The resulting composite could be imaged by selective exposure to infrared radiation (e.g. with a diode laser emitting at 830 or 1064 nm) and could be developed with a sodium silicate developer.

Example 9

A solution of 100 grams of polypropylene glycol monobutyl ether ($M_n$~1000) and 10.1 grams of $NEt_3$ in 300 mL of toluene was added dropwise to a solution of 18.6 grams of 4-nitrobenzoyl chloride in 100 mL of toluene. The exothermic reaction was controlled so as not to exceed 50° C. Once the addition was complete, the reaction mixture was stirred for 10–15 min. and the resulting slurry filtered to remove $NEt_3HCl$.

The toluene solution was placed in a hydrogenation bottle and the system purged with $N_2$. 2.65 grams of dry 5% Pd/C was added. The hydrogenation bottle was evacuated and refilled with nitrogen three times. Next, the system was evacuated and filled with hydrogen. Reduction was continued, with periodic additions of hydrogen, until hydrogen uptake ceased. The slurry was filtered to remove Pd/C and the filtrate dried over sodium sulfate. Next, the dried solution was filtered again to remove the sodium sulfate. Lastly, the toluene was removed under reduced pressure on a rotary evaporator yielding poly(propyleneglycol monobutyl ether)-4-aminobenzoate.

To a stirred mixture of 26.9 grams of poly(propyleneglycol monobutyl ether)-4-aminobenzoate, 90 mL of methylethyl ketone (MEK), 10 mL of water, 1.9 grams of toluenesulfonic acid, and 10 grams of carbon black was added 2.8 grams of dicyclohexylammonium nitrite. The carbon black had a surface area of 200 $m^2/g$ and a DPBA of 117 mL/100 g. The product was purified with 1-methoxy-2-propanol in a diafiltration apparatus and was found to have 0.17 meq/g of attached $—C_6H_4CO_2[CH(CH_3)CH_2O]_n CH_2CH_2CH_2CH_3$ groups, where n is an average of 16. A coating composition was prepared by mixing together 28 grams of a 10.7 wt % dispersion of the above carbon black product in 1-methoxy-2-propanol, 12 grams of a phenolic resin, and 10 grams of 1-methoxy-2-propanol. The resulting dispersion was coated onto a grained anodized aluminum plate to give a uniform wet coating with a thickness of 25 microns. The coating was air dried. The resulting composite could be imaged by selective exposure to infrared radiation (e.g. with a diode laser emitting at 830 or 1064 nm) and could be developed with a sodium silicate developer.

Example 10

A nitrogen purged flask was charged with 100 grams of polyacrylic acid ($M_w$~2000), 50 grams of dimethoxyethyl ether and 17 grams of 4-nitrophenethyl alcohol. The flask was fitted with a water cooled condenser and was heated to 170–180° C. for 4 hours. During the course of the reaction, water which had condensed at the nitrogen inlet was removed. The resulting product was then diluted with 100 mL of THF and placed in a Parr hydrogenator along with 5.2 grams of wet 5% Pd/C (50% water). Hydrogenation was carried out until the nitro groups were converted to amines. The product which resulted was polyacrylic acid containing 4-aminophenethyl ester groups.

To a solution of 250 mL water, 250 mL ethanol, and 50 grams of the above substituted polyacrylic acid was added 50 grams of a carbon black having a surface area of 200 $m^2/g$ and a DPBA of 117 mL/100 g. To the stirred slurry was then added a solution consisting of 3.6 grams of sodium nitrite and 20 mL of water. After mixing for 30 min., the resulting dispersion was purified by diafiltration with water. The final product was a dispersion having a solid content of 10 wt %. On dry basis, each gram of carbon black product contained 0.10 meq/g of attached polyacrylic acid ($M_w$ about 2000).

Example 11

A solution of 60 g GA2299 resin in 60 g of dimethylformamide was prepared by heating the mixture at reflux. GA2299 styrenated acrylic resin is available from B.F. Goodrich, Cleveland, Ohio, and has a MW of 11000 and an acid number of 200. A solution of 1.18 g of p-phenylene diamine in 20 g of dimethylformamide was added and the solution was heated at reflux for an additional 30 minutes. The reaction product was a solution of an aminophenyl derivative of the polymer.

A stirring mixture of 120 g of the aminophenyl polymer solution, 60 g of carbon black, and 350 mL of acetone was prepared. The carbon black had a surface area of 200 $m^2/g$ and a DPBA of 117 mL/100 g. A solution of 1.05 g of methanesulfonic acid in 50 g of water was added. A solution of 0.75g of $NaNO_2$ in 50 g of water was added dropwise, and mixing was continued for an additional 90 min. Aqueous ammonium hydroxide (39 g of a 28% solution) was added and the product was purified with water in a diafiltration device to give a dispersion of a carbon black product with attached polymer.

Example 12

The procedure of Example 11 was repeated, except that a carbon black with a surface area of 110 $m^2/g$ and a DPBA of 114 mL/100 g was used.

Example 13

A solution of 150 g NeoCryl BT520 resin dispersion in 275 g of dimethylformamide was prepared by heating the mixture at reflux. NeoCryl BT520 acrylic resin dispersion is available from NeoResins, Wilmington, Mass., and has a MW of 10000–15000, an acid number of 65 and a solid content of 40%. A solution of 1.04 g of p-phenylene diamine in 20 g of DMF was added and the solution was heated at reflux for an additional 8 hours. The reaction product was an aminophenyl derivative of the polymer.

A stirring mixture of 425 g of the aminophenyl polymer solution, 60 g of carbon black, and 200 mL of acetone was heated to 40° C. The carbon black had a surface area of 200 $m^2/g$ and a DPBA of 117 mL/100 g. A solution of 0.92 g of methanesulfonic acid in 20 g of water was added. A solution of 0.66 g of $NaNO_2$ in 20 g of water was added dropwise, and high shear mixing was continued for an additional 90 min. Aqueous ammonium hydroxide (13 g of a 28% solution further diluted with 200 g of water) was added and the product was purified with water in a diafiltration device to give a dispersion of a carbon black product with attached polymer.

Example 14

To 10 grams of the carbon black dispersion prepared in Example 10 was added 0.06 grams of sodium hydroxide followed by 0.635 grams of ARQUAD® DMHTB quaternary ammonium compound. The flocculated material was filtered, washed with water and dried at 70° C. A coating composition was prepared by mixing together 1 gram of the carbon black product in 16.7 grams of 24 wt % a phenolic resin in 1-methoxy-2-propanol, and 15.6 grams of 1-methoxy-2-propanol. The mixture was placed into a Midget mill containing 200 grams of stainless steel shot. The mill was sealed and placed in a paint shaker for 2 hours. Dispersion quality was checked with a Hegeman grind gauge and found to be at least 7 on the gauge scale. The resulting dispersion was coated onto a grained anodized aluminum plate to give a uniform wet coating with a thickness of 25 microns. The coating was air dried. The resulting composite could be imaged by selective exposure to infrared radiation (e.g. with a diode laser emitting at 830 or 1064 nm) and could be developed with a sodium silicate developer.

An aqueous dispersion of 34.2 grams of Cab-O-Jet® 300 black dispersion (commercially available from Cabot Corporation, Billerica, Mass.) was reacted with 0.8 grams of ARQUAD® DMHTB quaternary ammonium compound. The carbon black product was isolated by filtration, washed with water, and dried at 70° C. 1.5 grams of the resulting carbon black product were mixed with 25 grams of a solution of 24 wt % HRJ-2606 phenolic resin in 1-methoxy-2-propanol and 25 grams of 1-methoxy-2-propanol. The mixture was placed into a Midget mill containing 200 grams of stainless steel shot. The mill was sealed and placed in a paint shaker for 2 hours. Dispersion quality was checked with a Hegeman grind gauge and found to be at least 7 on the gauge scale. The resulting dispersion was coated onto a grained anodized aluminum plate to give a uniform wet coating with a thickness of 25 microns. The coated plate was air dried. The resulting composite could be imaged by selective exposure to infrared radiation (e.g. with a diode laser emitting at 830 or 1064 nm) and could be developed with a sodium silicate developer.

Example 16

The aqueous carbon black product prepared in Example 1 was mixed with the materials in Table 1 using the ratio specified to make an infrared absorbing coating composition. The composition was coated onto grained anodized aluminum to give a uniform wet coating with a thickness of 25 microns. The coating was air dried.

TABLE 1

| | Supplier | Parts |
|---|---|---|
| Polyvinyl Alcohol (Mw = 77,000–79,000) (5% in water) | J.T. Baker | 15.0 |
| Polyurethane dispersion Neorez XR-9624 (12.8% in water) | Zeneca | 11.7 |
| Cymel 303 | Cytec | 0.63 |
| Byk 451 catalyst (26% in water) | Byk Chemie | 0.38 |
| Triton X-100 | Rohm and Haas | 0.12 |
| 2-butoxyethanol | Aldrich Chemical | 1.25 |
| Carbon black dispersion (10% in water) | | 16.5 |
| Water | | 3.1 |

Coating compositions were prepared similarly with dispersions of the modified carbon black products prepared in Examples 2–4 and 10. Each were coated onto grained anodized aluminum to give a uniform wet coating with a thickness of 25 microns.

Example 17

This example describes the application of the infrared absorbing coating compositions of Example 16 to the preparation of lithographic printing plates. Infrared sensitive lithographic printing plates can be prepared using a grained anodized aluminum sheet with a silicate overlayer. The aluminum sheet is first coated at 25 microns with the coating composition of Table 2. The coating composition can be applied to the aluminum substrate via a knife coater or wire wound rod or other suitable means.

TABLE 2

| | Supplier | Parts |
|---|---|---|
| Polyvinyl Alcohol (Mw = 77,000–79,000) | J.T. Baker | 6.25 |
| Ammonium Zirconyl Carbonate (Bacote 20) | Magnesium Elektron | 2.50 |
| Glycerol | Aldrich Chemical | 0.25 |
| Triton X-100 | Robin and Haas | 0.10 |
| Water | | 135 |

After curing the coating for 2 minutes at 145° C., the infrared absorbing coatings of Example 16 can be applied to the aluminum plate to a wet coating thickness of 25 microns. After drying to remove the volatile solvents and to cure the coating, the resulting composite can be imaged by selective ablation of the carbon black containing layer using infrared radiation (eg. a diode laser emitting between the wavelengths of 800 and 1200 nm).

Example 18

Ascorbic acid (0.9 g) and 1.47 g of potassium persulfate were added to a solution prepared from 15 g of a Carboset acrylic resin, 10 ml of 28% ammonium hydroxide and 227 g of water. After addition of 71.3 g styrene, 3.8 g of glycidyl methacrylate and 3 g of bromotrichloromethane, the mixture was heated to 35° C. under nitrogen for seven hours and yielded a polymer latex. The polymer latex was diluted with water to 12% solids.

The carbon black products of Examples 1–4 and 10–13 were diluted with water to form dispersions with 9.9% solids. Coatings compositions were prepared from 1 part of the polymer latex, 0.84 parts of the carbon black product dispersions, and 0.79 parts of isopropanol. The coating was applied to a grained anodized aluminum plate using a knife coater to give a wet film thickness of 20 microns and was subsequently dried. The resulting composite could be imaged by selective exposure to infrared radiation (e.g. with a diode laser emitting at 830 or 1064 nm) and could be developed with a sodium silicate developer.

Example 19

A solution of 0.77 g of sodium dodecyl sulfate and 0.48 g of ammonium persulfate in 135 g of water was stirred at 70° C. under nitrogen. A mixture of 36.8 g of styrene, 2.53 g of glycidyl methacrylate and 1.92 g of divinylbenzene was added over a period of 105 min. The reaction was continued for an additional 3 hr and yielded a microgel. The microgel was diluted with water to 12% solids.

The carbon black products of Examples 1–4 and 10–13 were diluted with water to form dispersions with 9.9% solids. Coatings compositions were prepared from 1 part of the microgel, 0.75 parts of the carbon black product dispersions, and 1.7 parts of isopropanol. The coating could be applied to a Polychrome Vector P95 positive working UV sensitive lithographic printing plate. After drying, the plate could be imaged by selective exposure to infrared radiation (e.g. with a diode laser emitting at 830 or 1064 nm) and could be developed with a Polychrome PC955 developer diluted to 10% in water. The plate could be exposed to UV radiation in a conventional contact exposure frame and could be subsequently developed with a Polychrome PC4000 positive developer.

Example 20

A solution of 0.77 g of sodium dodecyl sulfate and 0.48 g of ammonium persulfate in 135 g of water was stirred at 70° C. under nitrogen. A mixture of 36.8 g of styrene, 2.53 g of glycidyl methacrylate and 1.92 g of divinylbenzene was added over a period of 105 min. The reaction was continued for an additional 3 hr and yielded a microgel. The microgel was diluted with water to 12% solids.

The carbon black products of Examples 1–4 and 10–13 were diluted with water to form dispersions with 9.9% solids. Coatings compositions were prepared from 1 part of the microgel, 0.75 parts of the carbon black product dispersions, and 1.7 parts of isopropanol. The coating was applied to a grained anodized aluminum plate using a knife coater to give a wet film thickness of 20 microns and was subsequently dried. The resulting composite could be imaged by selective exposure to infrared radiation (e.g. with a diode laser emitting at 830 or 1064 nm) and could be developed with a sodium silicate developer.

Example 21

A solution of Joncryl® 611 acrylic resin in tetrahydrofuran (THF) having 31 wt % solids was dried using 3A molecular sieves. Joncryl® 611 acrylic resin is available from S.C. Johnson, Sturtevant, Wis., and has a MW of 8100 and an acid number of 53. Para-phenylene diamine (4.7 g) and then 8.9 g of 1,3-dicyclohexylcarbodiimide were added to 1126 g of the Joncryl® 611 acrylic resin solution, and the mixture was heated at reflux for 30 min. The mixture was filtered to give a solution of an aminophenyl derivative of the polymer with a solids content of 36 wt %.

A rotor stator was used to mix 853 g of the aminophenyl polymer solution, 300 g of carbon black and 400 mL of THF. The carbon black had a surface area of 50 $m^2/g$ and a DBPA of 46 mL/100 g. Methanesulfonic acid (3.54 g) was added. A solution of 2.55 g of $NaNO_2$ in 150 g of water was added dropwise, and mixing was continued for an additional 2 hr. The resulting dispersion was purified with a 20%/80% water/THF solution, THF and finally propylene glycol methyl ether acetate using a diafiltration device. The dispersion was diluted with THF, filtered through 20 micron, 10 micron, 5 micron, 3 micron, 1 micron and then 0.5 micron filters and concentrated under vacuum to a solids content of 14.5%. The resulting material was a dispersion of a carbon black product with attached polymer. A thermogravimetric analysis indicated that the solids contained 93% carbon black and 7% polymer.

The carbon black product could be used in coating formulations for black matrix applications. An estimate of the volume resistivity of such a coating was made by measuring the resistivity of a coating prepared from one part of the carbon black product dispersion, 0.191 parts of Joncryl 611 resin and 1.6 parts of propylene glycol methyl ether acetate. The resulting solids are 40% carbon black and 60% polymer. The resistivity of the film was 10E12 ohm-cm.

As noted above, the modified pigment products comprising the groups described above are useful in a wide variety of imaging applications.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

We claim:

1. A printing plate comprising: a) a substrate and b) a radiation-absorptive layer, wherein the radiation-absorptive layer comprises at least one modified pigment product comprising a pigment having attached at least one organic group represented by the formula -X-Sp-[EI]R, wherein X, which is directly attached to the pigment, represents an arylene, heteroarylene, or alkylene group, Sp represents a spacer group, EI represents an alkyleneimine polymer or copolymer, and R represents hydrogen, a substituted or unsubstituted alkyl group, or a substituted or unsubstituted aryl group.

2. The printing plate of claim 1, wherein EI is polyethyleneimine or derivatives of polyethyleneimine.

3. The printing plate of claim 1, wherein the radiation-absorptive layer further comprises an additional polymer.

4. The printing plate of claim 3, wherein the additional polymer is a phenolic polymer.

5. The printing plate of claim 4, wherein the phenolic polymer is a homopolymer or copolymer of an hydroxystyrene or a phenol-formaldehyde polymer.

6. The printing plate of claim 3, wherein the additional polymer is an acrylic polymer.

7. The printing plate of claim 6, wherein the acrylic polymer is a polymer comprising acrylic acid, methacrylic acid, or salts thereof.

8. The printing plate of claim 1, wherein the substrate is a hydrophilic metal substrate.

9. The printing plate of claim 1, wherein the substrate is aluminum or polyester.

10. The printing plate of claim 1, wherein the radiation absorbed by the radiation-absorptive layer is infrared or near-infrared.

11. The printing plate of claim 1, wherein the pigment is carbon black, graphite, vitreous carbon, finely-divided carbon, activated carbon, activated charcoal, or mixtures thereof.

12. The printing plate of claim 1, wherein the pigment is carbon black.

13. The printing plate of claim 1, wherein the pigment comprises a white pigment, a black pigment, a blue pigment, a brown pigment, a cyan pigment, a green pigment, a violet pigment, a magenta pigment, a red pigment, a yellow pigment, shades thereof, or combinations thereof.

14. A printing plate comprising: a) a substrate and b) a radiation-absorptive layer, wherein the radiation-absorptive layer comprises at least one modified pigment product comprising a pigment having attached at least one organic group represented by the formula -X-Sp-[SMA]R, wherein X, which is directly attached to the pigment, represents an arylene, heteroarylene, or alkylene group, Sp represents a spacer group, SMA represents a styrene-maleic anhydride polymer or derivative, and R represents hydrogen, a substituted or unsubstituted alkyl group, or a substituted or unsubstituted aryl group.

15. The printing plate of claim 14, wherein SMA is styrene-maleic anhydride or derivatives of styrene-maleic anhydride.

16. The printing plate of claim 14, wherein the radiation-absorptive layer further comprises an additional polymer.

17. The printing plate of claim 16, wherein the additional polymer is a phenolic polymer.

18. The printing plate of claim 17, wherein the phenolic polymer is a homopolymer or copolymer of an hydroxystyrene or a phenol-formaldehyde polymer.

19. The printing plate of claim 16, wherein the additional polymer is an acrylic polymer.

20. The printing plate of claim 19, wherein the acrylic polymer is a polymer comprising acrylic acid, methacrylic acid, or salts thereof.

21. The printing plate of claim 14, wherein the substrate is a hydrophilic metal substrate.

22. The printing plate of claim 14, wherein the substrate is aluminum or polyester.

23. The printing plate of claim 14, wherein the radiation-absorptive layer is absorptive of infrared or near-infrared radiation.

24. The printing plate of claim 14, wherein the pigment is carbon black, graphite, vitreous carbon, finely-divided carbon, activated carbon, activated charcoal, or mixtures thereof.

25. The printing plate of claim 14, wherein the pigment is carbon black.

26. The printing plate of claim 14, wherein the pigment comprises a white pigment, a black pigment, a blue pigment, a brown pigment, a cyan pigment, a green pigment, a violet pigment, a magenta pigment, a red pigment, a yellow pigment, shades thereof, or combinations thereof.

* * * * *

UNITED STATES PATENT AND TRADEMARK OFFICE

CERTIFICATE OF CORRECTION

PATENT NO. : 7,258,956 B2
APPLICATION NO. : 09/896886
DATED : August 21, 2007
INVENTOR(S) : Galloway et al.

It is certified that error appears in the above-identified patent and that said Letters Patent is hereby corrected as shown below:

At column 16, lines 20-21, the formula “$p$-$C_6H_4(N^+C_5N_5)$ $NO_3^-$” should be replaced with --$p$-$C_6H_4(N^+C_5H_5)$ $NO_3^-$--.

Signed and Sealed this

Eighth Day of September, 2009

David J. Kappos
*Director of the United States Patent and Trademark Office*